United States Patent
Blackwell

(10) Patent No.: US 7,102,887 B2
(45) Date of Patent: Sep. 5, 2006

(54) HOUSING FOR HOT PLUGGABLE NETWORK TAPS

(75) Inventor: Donald A. Blackwell, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 198 days.

(21) Appl. No.: 10/764,592

(22) Filed: Jan. 23, 2004

(65) Prior Publication Data

US 2004/0228090 A1 Nov. 18, 2004

Related U.S. Application Data

(60) Provisional application No. 60/470,610, filed on May 15, 2003, provisional application No. 60/508,532, filed on Oct. 2, 2003.

(51) Int. Cl.
*H05K 7/20* (2006.01)
*H05K 7/16* (2006.01)
*H05K 7/00* (2006.01)

(52) U.S. Cl. ............... 361/695; 361/690; 361/694; 361/716; 361/725; 361/727; 361/728; 361/729; 454/184

(58) Field of Classification Search ............... 361/695
See application file for complete search history.

(56) References Cited

U.S. PATENT DOCUMENTS

| 4,904,198 | A | * | 2/1990 | Begitschke et al. ......... 439/281 |
| 5,691,504 | A | | 11/1997 | Sands et al. |
| 5,730,628 | A | * | 3/1998 | Hawkins .................. 439/843 |
| 5,807,131 | A | * | 9/1998 | Allen et al. ............... 439/394 |
| 6,493,233 | B1 | | 12/2002 | De Lorenzo et al. |
| 6,741,477 | B1 | | 5/2004 | Siversten |

* cited by examiner

*Primary Examiner*—Boris Chervinsky
(74) *Attorney, Agent, or Firm*—Workman Dydegger

(57) ABSTRACT

A housing for hot-pluggable network tap modules. The housing allows a user to maintain all network taps in any given system in one housing and location. This increases the ease of maintaining multiple network taps and allows the network tap modules to be powered by a power supply included with the housing. The housings can greatly simplify the process of managing multiple taps. Moreover, the housing are compatible with hot-pluggable network tap modules as well as legacy network tap modules that were developed in the past.

30 Claims, 17 Drawing Sheets

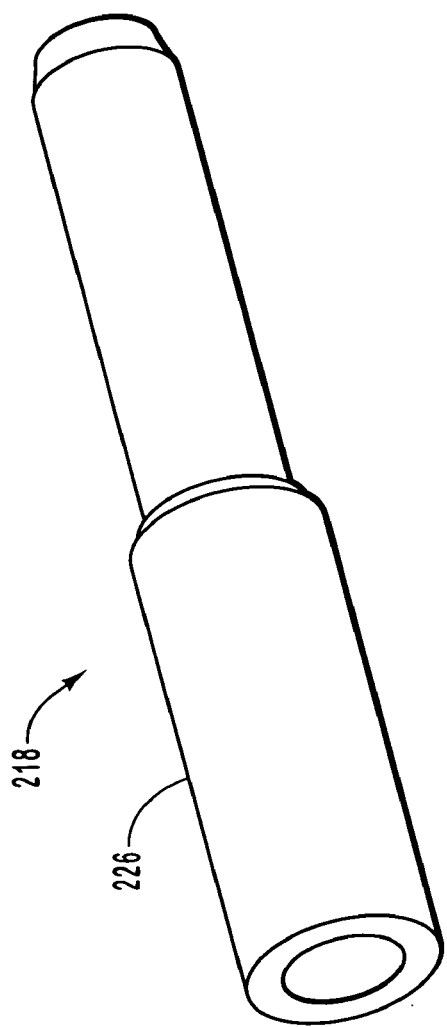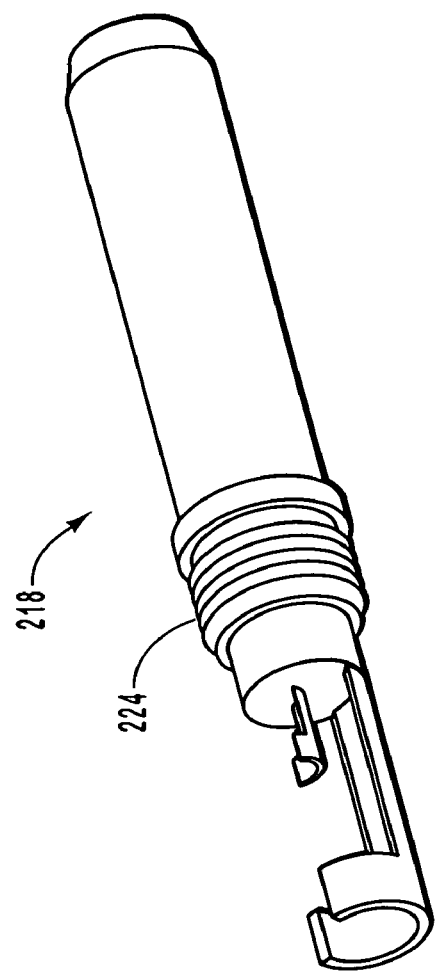

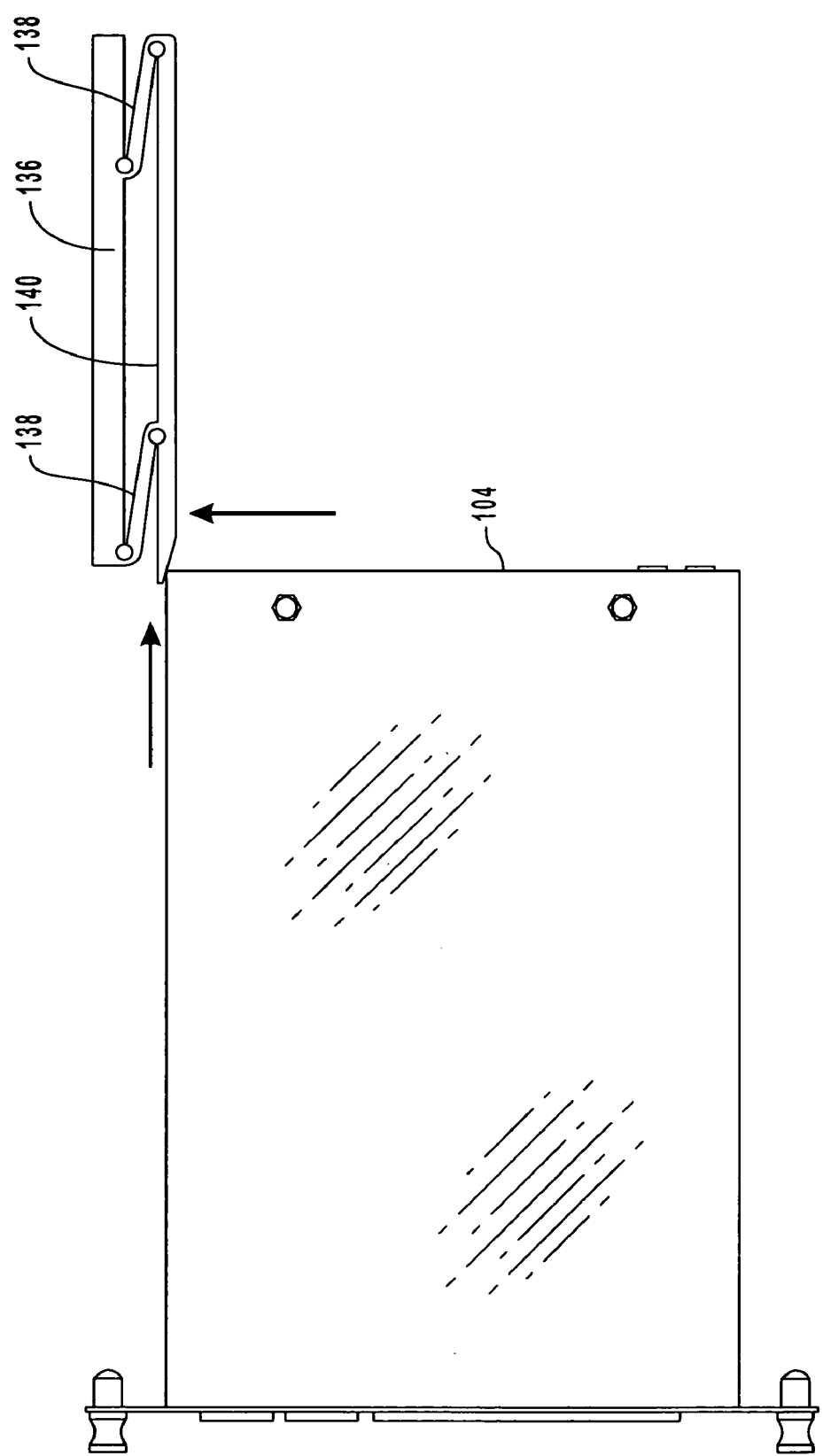

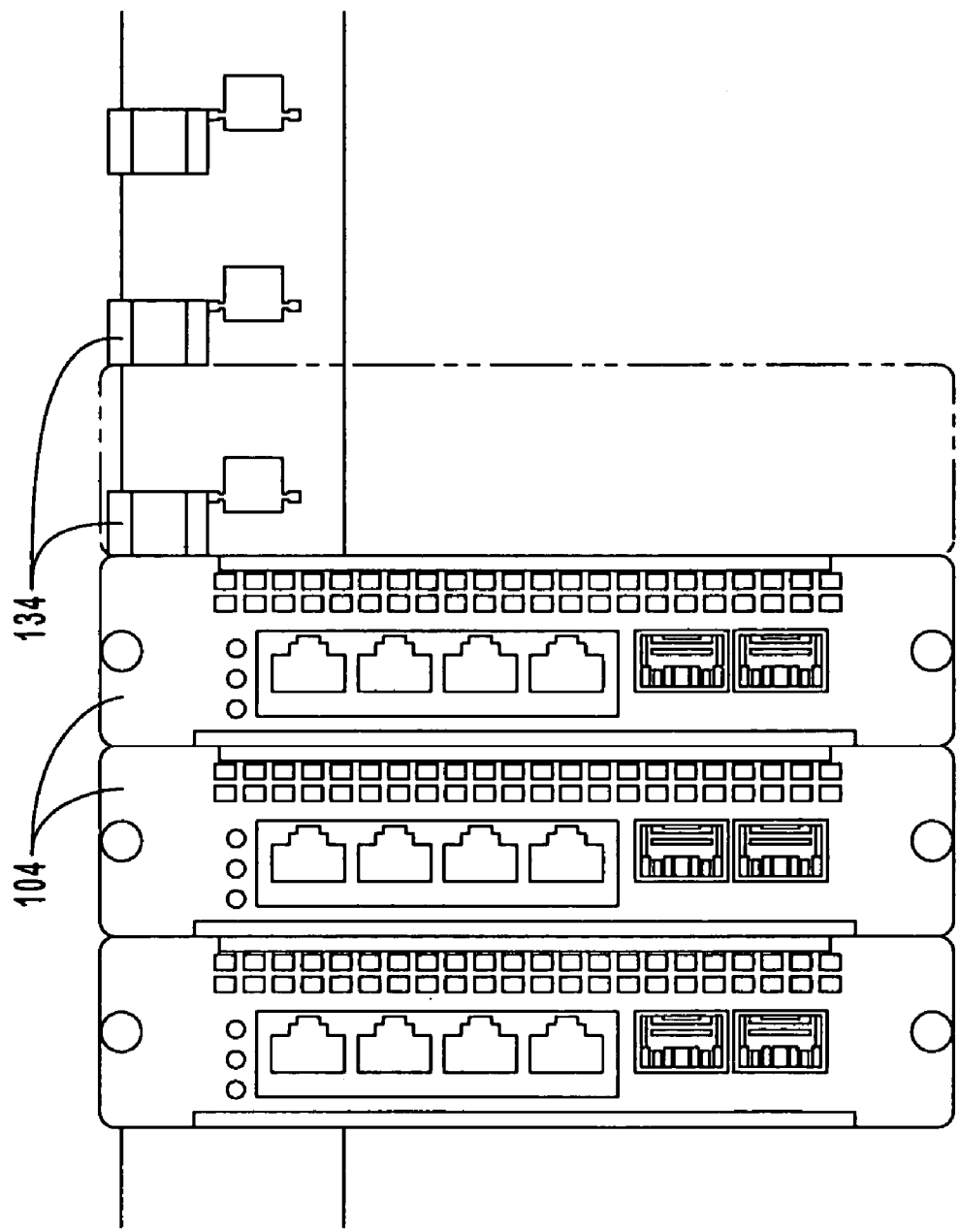

HOUSING FOR HOT PLUGGABLE NETWORK TAPS

BACKGROUND OF THE INVENTION

1. Related Applications

The present application claims priority to U.S. Provisional Patent Application Ser. No. 60/470,610, with a filing date of May 15, 2003 entitled "HOUSING FOR HOT PLUGGABLE NETWORK TAPS," and U.S. Provisional Patent Application Ser. No. 60/508,532, with a filing date of Oct. 2, 2003 entitled "HOUSING FOR HOT PLUGGABLE NETWORK TAPS," each of which is incorporated herein by reference in its entirety.

2. The Field of the Invention

The present invention relates to network taps for providing access to network data for analysis purposes. More specifically, the present invention relates to housings for receiving a set of pluggable network tap modules, including a shared power supply used by the network tap modules

3. The Relevant Technology

In recent years, it has become increasingly important to have the ability to monitor and analyze the data flow in communication channels between and within networks. Some of these reasons include monitoring the communication channel for certain types of data, identifying and diagnosing network problems, detecting interruptions in the communication channel, detecting degradation in the communication channel, and the like. Thus, network taps, which are systems for tapping into communication lines, have been developed. In general, a network tap is a device that is positioned in-line in a network communication line and enables network analyzers or other devices to have access to a copy of the data transmitted over the communication line. A network tap is typically installed by physically cutting or breaking a network cable and positioning the tap between the two ends of the network cable. Once the tap is installed, network analyzers or other devices can access the network data without having to manipulate the network cable or altering the topology of the network. Moreover, conventional network taps enable access to the network data without disrupting or modifying the network data or the topology of the network.

Systems using conductors composed of metallic materials such as copper or other low resistance metals have generally been relatively easy to monitor and evaluate without great disruption or intrusion into the communication channel since current flows throughout the entire conductor and portions of the conductor can be externally tapped with another conductor attached to the test equipment that bleeds off a negligible amount of test current.

Additionally, optical fibers that transmit light have also been used as a communication channel medium and have proven to be advantageous for the transmission of large amounts of information, both in digital and analog form. Optical fibers, unlike metallic conductors, propagate the information signal in a constrained directional path. Furthermore, the optical signal propagates primarily in a relatively narrow internal portion of the conductor, making non-intrusive external tapping of the fiber impractical. Therefore, in order to monitor data transmitted on an optical fiber, a splitter, also known as a coupler, must be placed in-line with the optical fiber to reflect a portion of the light from the main optical fiber to another optical fiber that can be coupled to a network analyzer or other test equipment.

Existing network taps typically are housed within a module including a faceplate through which various connections may be made. For example, the network tap module may include a set of in-line pass through connections to allow the tap to be positioned in line with the network (e.g. an "in" and "out" connection) in addition to one or more connections which allow a user to tap into the network for analysis purposes. Existing network tap modules also include a connector for receiving power, typically at the rear of the module.

Each network tap module allows the user to tap into the network at one specific location or on one selected cable or communication link between nodes in a network. Often, it is desirable to tap into the network at multiple communication links. To do this, a separate network tap must be inserted into each communication link to be accessed. Multiple taps also facilitate accessing and monitoring multiple channels that carry network data. Because each network tap module must be connected to a power supply, this can result in a system of network tap modules spread throughout a network, each module connected to its own power supply.

The several power supplies may represent a significant cost and, when multiple network tap modules are stored together, a separate power supply and the associated power cables for each tap module is inconvenient and intrusive. Furthermore, having individual network tap modules scattered throughout a network can be inefficient and confusing. In addition, each time a tap is inserted into a network, another potential link failure point is introduced into the network. Network link failures may result in loss of critical communication and data. Although network reliability is highly important, many network administrators have had to sacrifice reliability for the advantages gained from using conventional network taps. It would thus be an advantage to reduce the inefficiency and confusion of having the network tap modules scattered throughout the system. Furthermore it would be an advantage to reduce the number of power supplies required for the several network tap modules. It would also be useful to provide a network tap system that significantly reduces the likelihood of link failure at network taps.

BRIEF SUMMARY OF THE INVENTION

The present invention relates to a housing for hot-pluggable network tap modules. The housing allows the user to maintain all network taps in any given system in one housing and location. This increases the ease of maintaining multiple network taps and allows the network tap modules to be powered by a power supply or redundant, hot-swap power supplies included with the housing. The housings of the invention can greatly simplify the process of managing multiple taps. Moreover, the housing of the invention is compatible with hot-pluggable network tap modules as well as legacy network tap modules that were developed prior to the invention disclosed herein.

According to one embodiment, the housing includes a chassis and a power supply or power supplies for providing power to a plurality of power supply connectors. The housing may also include a plurality of displaceable card guides. The housing provides a physical superstructure that can be used to fix the position of a set of network tap modules, which represents a significant improvement over conventional methods of managing a number of taps, which typically has involved stacking taps without a common housing or storing taps in different physical locations. Moreover, the housing can be used to receive hot-pluggable network tap modules designed specifically for use with the housing as well as legacy network tap modules that existed prior to the invention of the housings of the invention.

The chassis may be a rack or other structure that is capable of receiving or supporting several network tap modules. The chassis is designed to receive a plurality of network tap modules with little or no space between them, resulting in a high packing ratio. The chassis may also include one or more cooling fans or other means of cooling for drawing hot air out from the inside of the housing.

The housing includes a power supply for providing power to a plurality of power supply connectors. A power supply that is shared by multiple tap modules in a single housing eliminates the space and inconvenience that would otherwise be associated with each tap module having its own power supply and corresponding power cables. Redundant, hot-swap power supplies may be incorporated into the housing to improve system reliability. The power supply incorporated into the housing of the invention may also include cooling fans or other means of cooling (e.g. heat sinks, etc).

Much of the advantage of redundant power supplies may be lost if a power supply failure is not noted in a timely fashion in situations when a failure of the redundant power supply would cause the tap to fail. This situation may be overcome by providing a simple status light that indicates that a power supply is operating correctly. Another more robust approach is to add remote status evaluation via a monitoring port. This may be achieved by using chip sets or other devices that provide monitoring information, such as power supply failure indication, using Simple Network Management Protocol (SNMP) or another standard protocol over an Ethernet link.

The power supply is connected to a plurality of power supply connectors. This allows distribution of power to the individual power connectors, with each power supply connector being positioned to mate with and provide power to one network tap module. This configuration eliminates the need for separate power supplies for each network tap module.

The housing may include a plurality of displaceable card guides. The card guides allow the network tap modules to be closely packed, while still providing a surface to guide each module as it is inserted.

According to one embodiment, the displaceable card guides each include a base, two retractable arms, and a guide. The base is attached to the inside roof of the chassis. A first end of each retractable arm is attached to the base, while a second opposite end of each arm is attached to the guide. As a module is inserted, it contacts the sloped leading edge of the guide. This contact continues as the module is pushed into the chassis of the housing and the retractable arms progressively retract to a final position.

Inclusion of the optional displaceable card guides eliminates the need for interior walls or other such guides that would physically separate adjacent network tap modules when inserted into the housing. Elimination of such structures allows the housing to have a high packing ratio. Such structures are also difficult to manufacture and are prone to damage due to their very high aspect ratio. In summary, the housing provides the ability to locate and maintain a plurality of network tap modules in one location, while also eliminating the need for each module to have its own power supply.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by references to specific embodiments thereof, which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 8 is a perspective view of a barrel plug with the jacket intact;

FIG. 9 is a perspective view of the barrel plug of FIG. 8 with the jacket removed;

FIG. 17 is a side view of a network tap module being inserted into a housing so as to cause a card guide to retract during insertion;

FIG. 18 is a section view showing relative positions of card guides to network tap modules within the housing of FIG. 1.

DETAILED DESCRIPTION OF THE INVENTION

The following paragraphs provide details regarding embodiments of a housing for hot-pluggable network tap modules. The housing allows the user to maintain all network taps in any given system in one housing and location. This increases the ease of maintaining multiple network taps and allows the network tap modules to be powered by a power supply included with the housing. The housings of the invention can greatly simplify the process of managing multiple taps. Moreover, the housings of the invention are compatible with hot-pluggable network tap modules as well as legacy network tap modules that were developed prior to the invention disclosed herein. The housing includes a chassis, a power supply, and preferably a plurality of displaceable card guides, each of which will be described in more detail below.

1. Chassis

Figure 1:
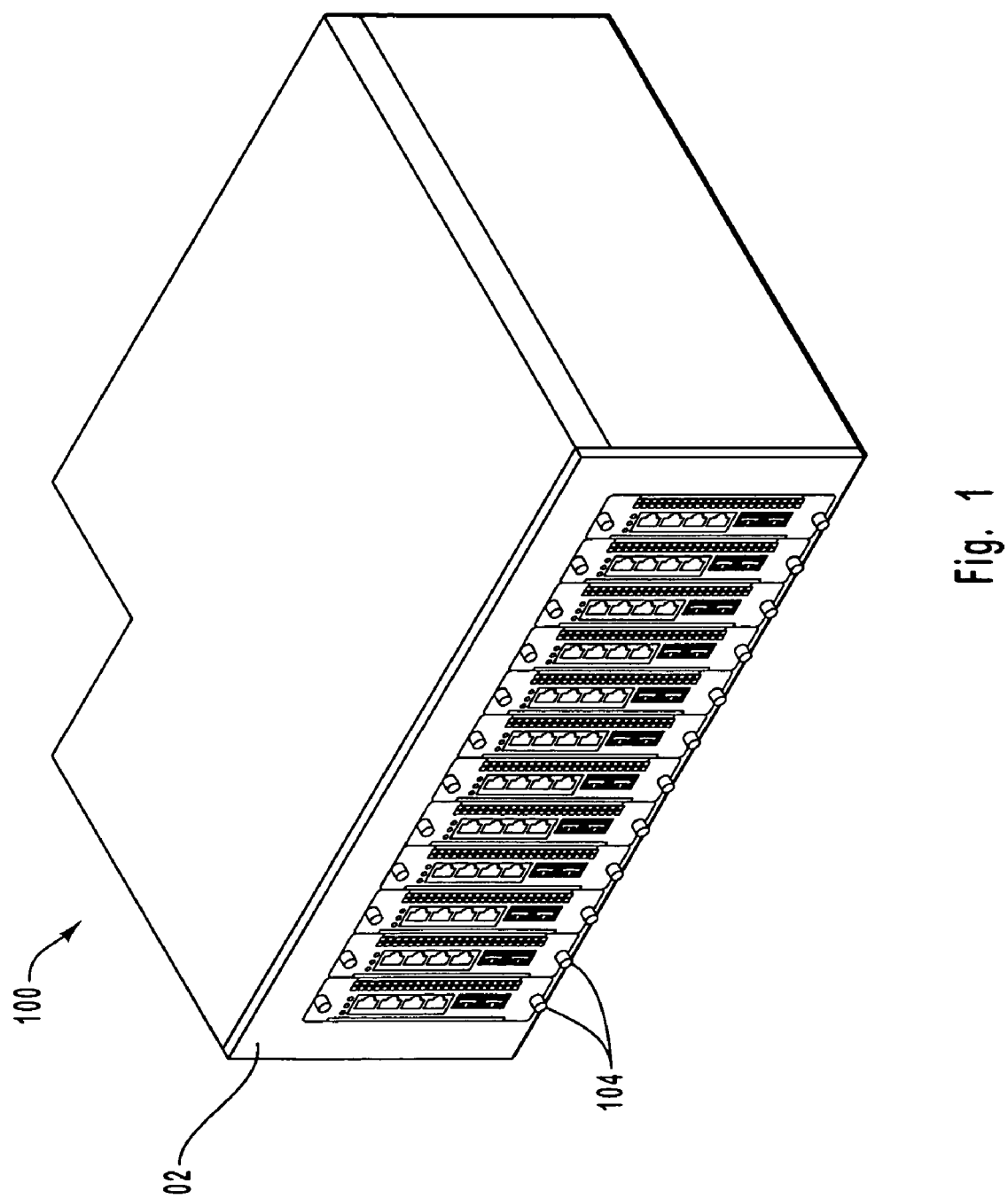
FIG. 1 is a perspective view of an embodiment of the housing of the present invention.
Figure 2:
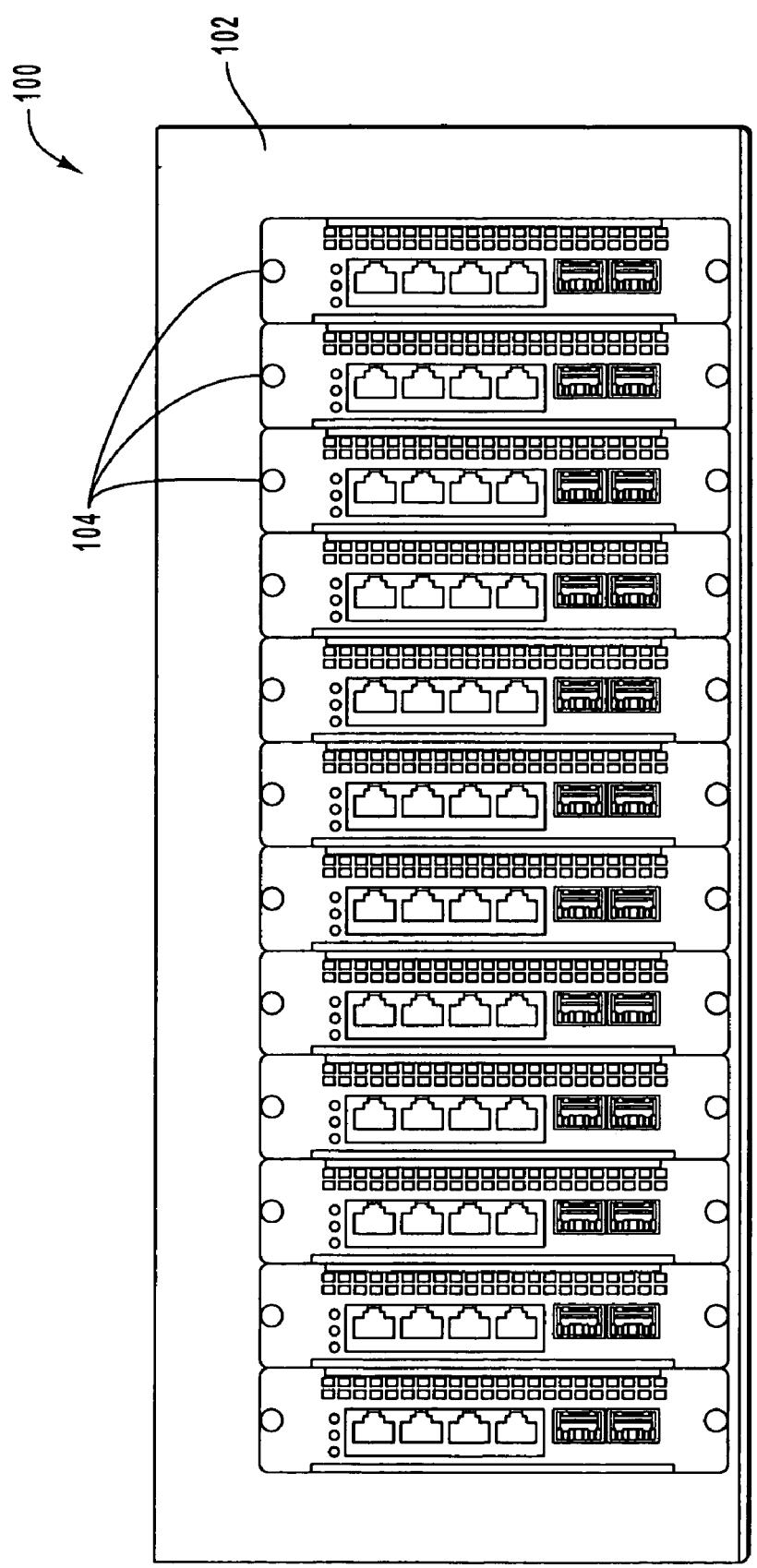
FIG. 2 is a front view of the embodiment of the housing of FIG. 1 with the housing filled with network tap modules.

The housing 100 includes a chassis 102 for receiving a plurality of hot-pluggable network tap modules 104. The chassis 102 may be a rack or other structure that is capable of receiving or supporting several network tap modules 104. One currently preferred embodiment of the housing 100 includes a chassis 102 designed to receive up to 12 network tap modules 104 with little or no space between them, resulting in a high packing ratio. Such an embodiment is illustrated from various perspectives in FIGS. 1–3. The chassis 102 may also include one or more cooling fans 105 (seen in FIG. 3) or other means of cooling (e.g. heat sinks, etc). Cooling fans may be vented to the exterior of the housing 100.

The housing 100 provides a physical superstructure that can be used to fix the position of a set of network tap modules 104, which represents a significant improvement over conventional methods of managing a number of taps, which typically has involved stacking taps without a common housing or storing taps in different physical locations. Moreover, the housing 100 can be used to receive hot-pluggable network tap modules designed specifically for use with the housing 100 as well as legacy network tap modules that existed prior to the invention of the housings of the invention. Two embodiments of the housing, the backplane of the chassis thereof, and the manner in which the power supply connectors are configured are presented below.

A. First Embodiment

Figure 4:
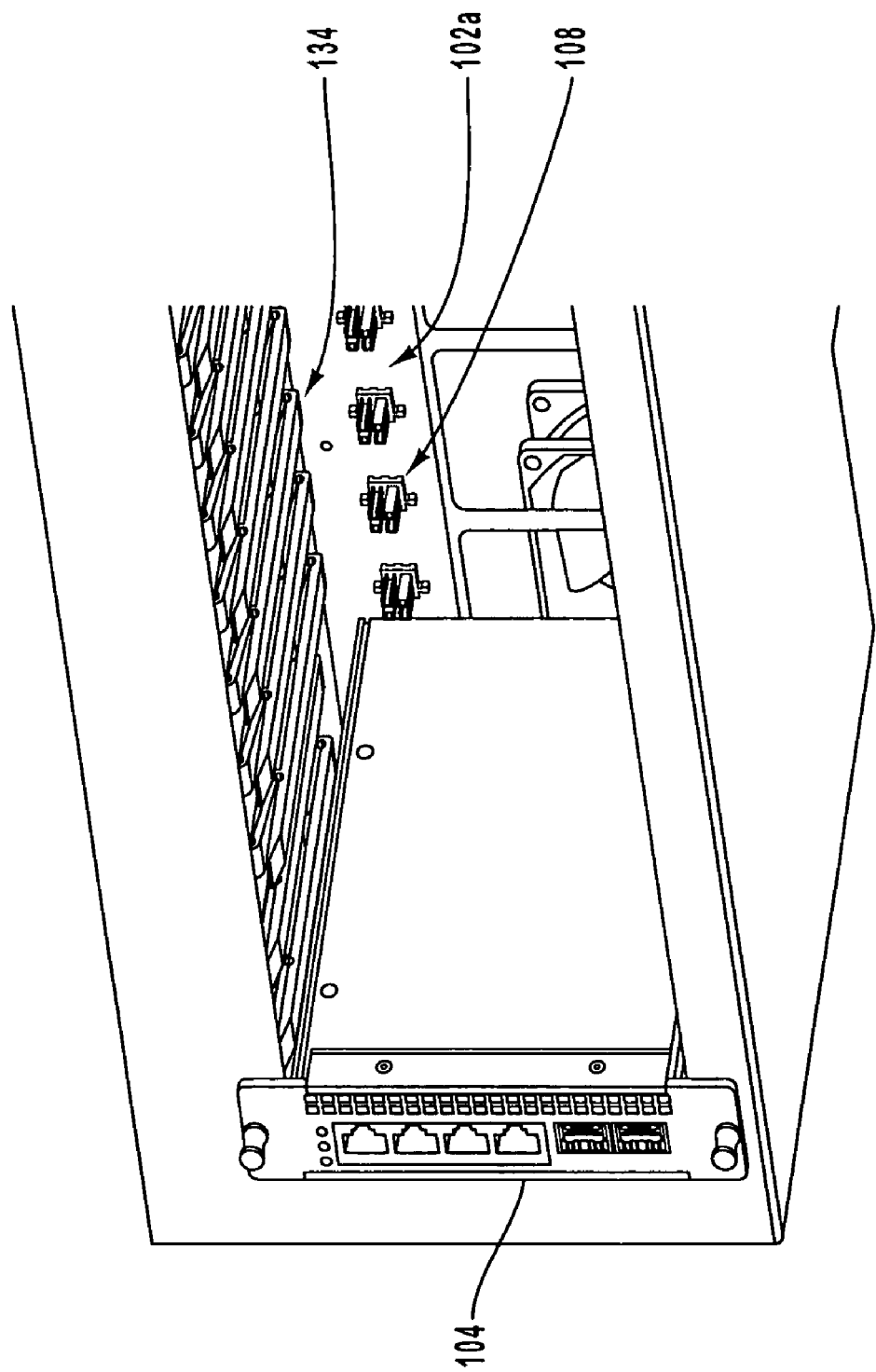
FIG. 4 is a front perspective view of the embodiment of the housing of FIG. 1 with the housing holding only one network tap module.
Figure 5:
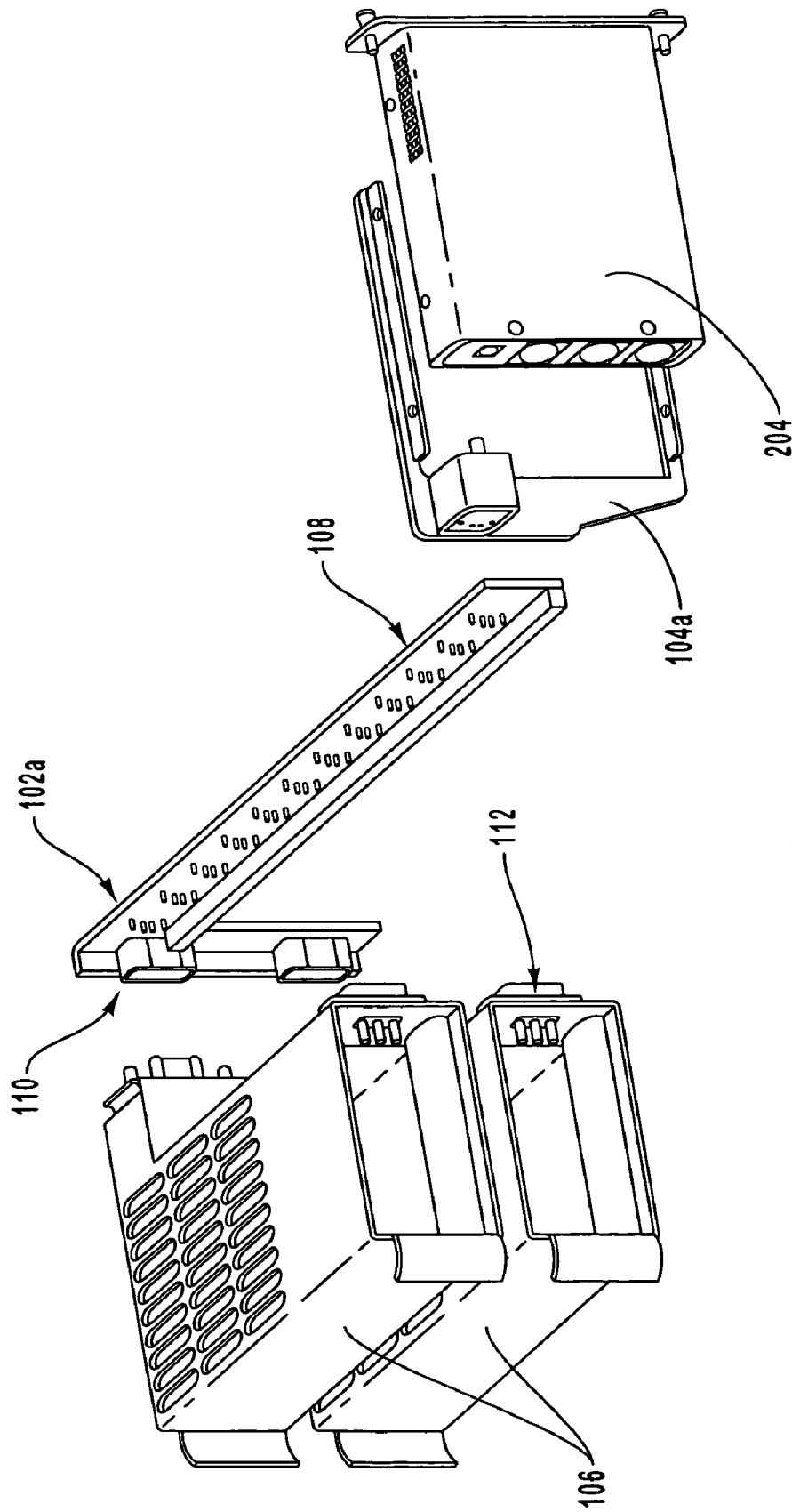
FIG. 5 is an exploded view of the embodiment of the housing of FIG. 1 with the sheet metal of the chassis removed for clarity.

FIGS. 4 and 5 show a housing 100 that includes a chassis 102 comprising sheet metal (not shown) and a back plane printed circuit board assembly (PCBA) 102a with specialized hot-swap connectors 108 for each of the 12 tap locations. The PCBA 102a also includes connectors 110 for the DC output of redundant, hot-swap power supply 106, fan connectors (not shown) and status signals (not shown). The backplane PCBA 102a is shaped as a backward "L" with the hot swap connectors 108 arranged on the long leg. The base leg holds the connectors 110 for the DC output of the power supply 106. This configuration presents the smallest area in the airflow direction to allow optimal cooling. While this configuration provides maximum cooling airflow, it does so by reducing the PCB surface area that is oz available for circuitry. As a result, the tap hot-swap components are located on the tap interface module.

Airflow considerations also generally preclude the placement of the power supply AC inlet connectors 112 on the backplane in this embodiment. The AC connectors 112 may be placed at the opposite end of the power supply 106 to keep power supply internal wiring lengths to a minimum. One consideration associated with this embodiment is the need to maintain proper alignment between connectors without applying costly dimensional tolerances.

FIG. 4 illustrates use of the housing 100 with a network tap module 104 which is designed specifically for use with the housing 100, while FIG. 5 illustrates use of the housing 100 with a legacy network tap module 204 that requires use of an additional adapter, 104a.

B. Second Embodiment

Figure 6:
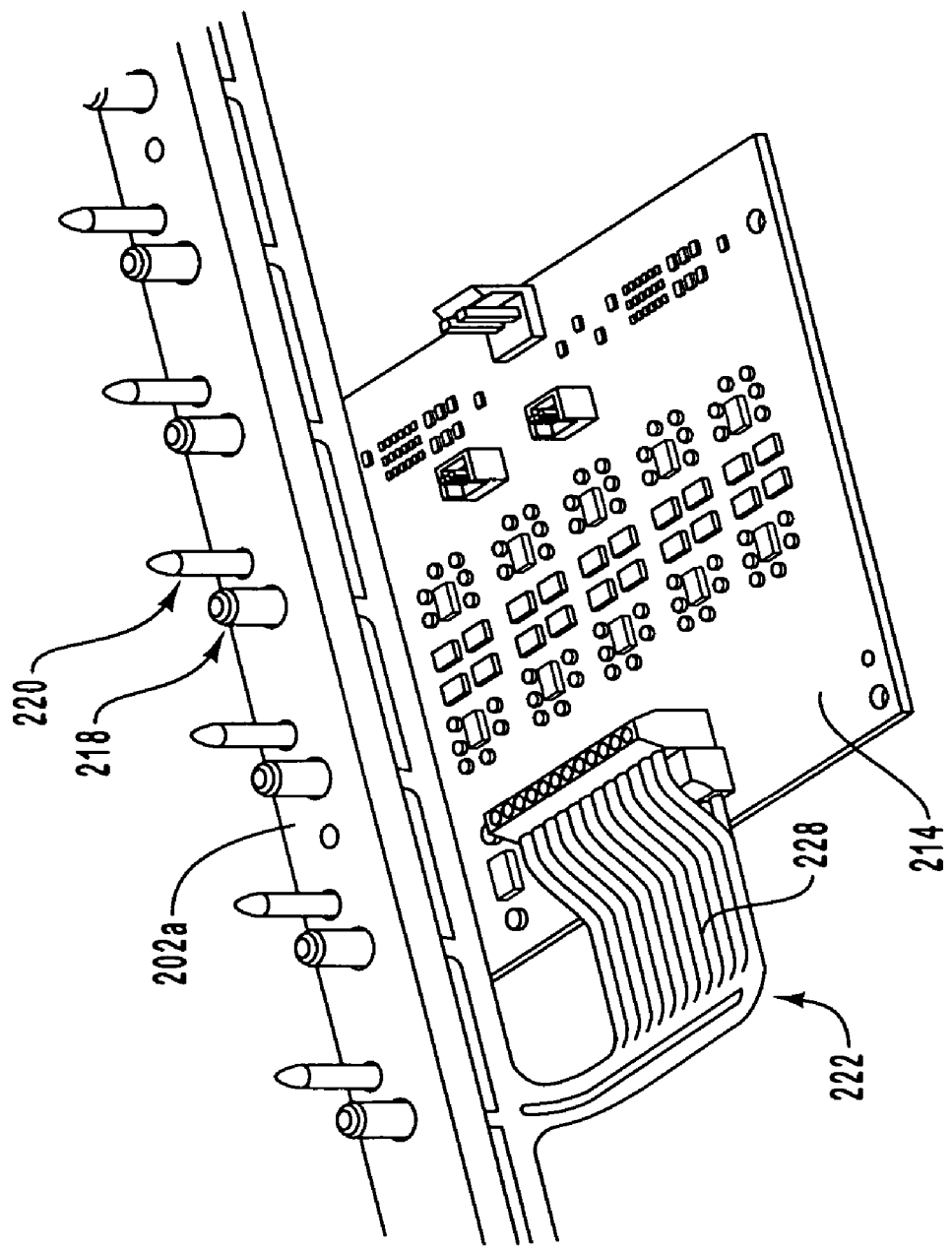
FIG. 6 is a close up view of a barrel plug retainer assembly and power distribution printed circuit board assembly.

As described in U.S. Provisional Patent Application Ser. No. 60/470,582, entitled "HOT PLUGGABLE ADAPTER FOR LEGACY POWER SUPPLY CONNECTORS", which was filed May 15, 2003 and is incorporated herein by reference, a simplified adapter can be constructed from a barrel plug adapter normally used to convert a 5.5 mm×2.1 mm barrel plug to a 5.5 mm×2.5 mm barrel plug and a standard 5.5 mm×2.1 mm barrel plug that is made for hand wiring applications. The application of the 5.5 mm×2.1 mm barrel plug allows the backplane PCBA 102a of FIGS. 4 and 5 to be replaced by a barrel plug retainer assembly 202a. The barrel plug retainer assembly 202a of this embodiment is illustrated in FIG. 6.

Figure 7:
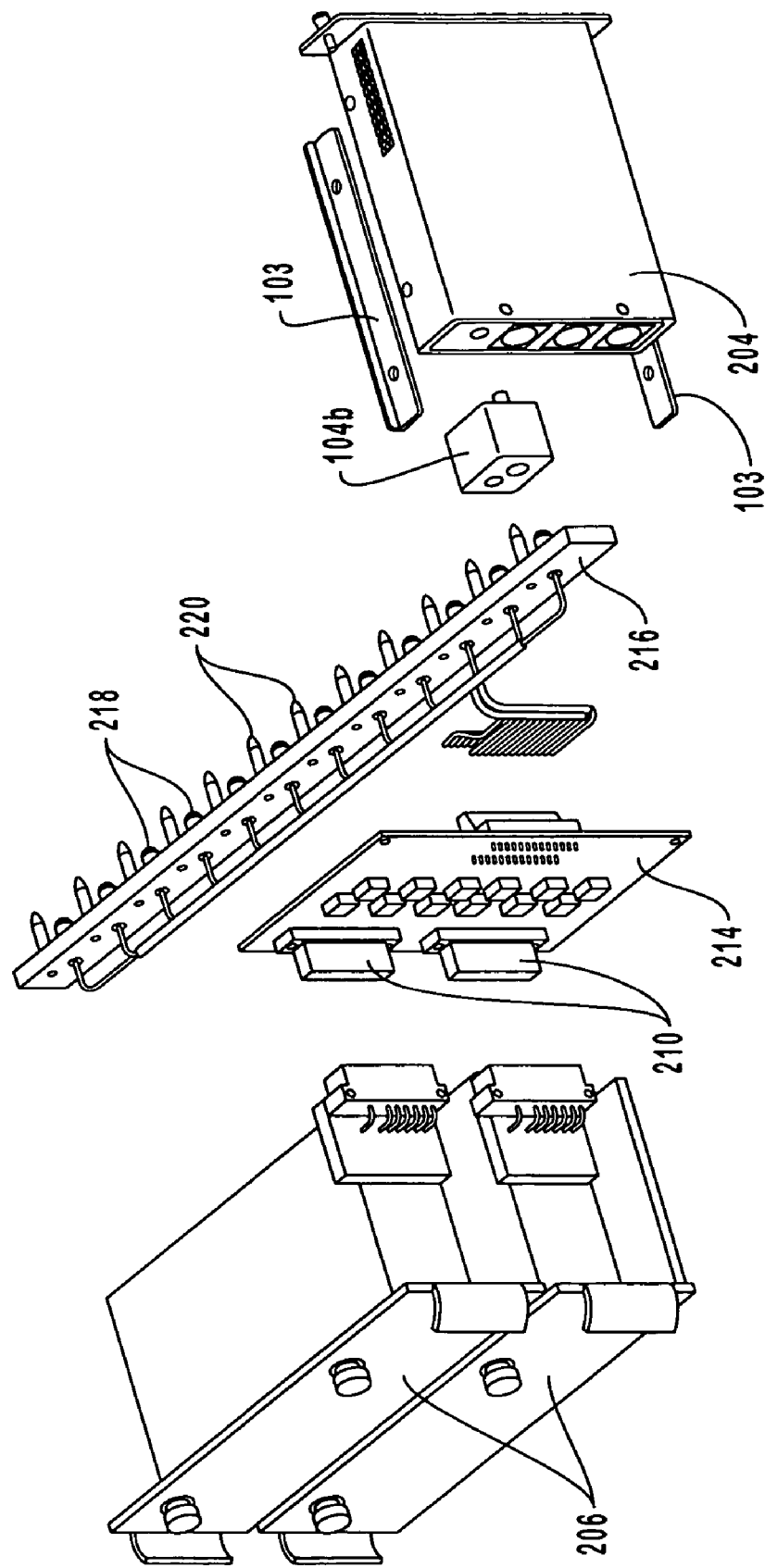
FIG. 7 is an exploded view of an alternative embodiment of a housing incorporating the barrel plug retainer assembly and power distribution printed circuit board assembly of FIG. 6 with the sheet metal of the chassis removed for clarity.
Figure 10:
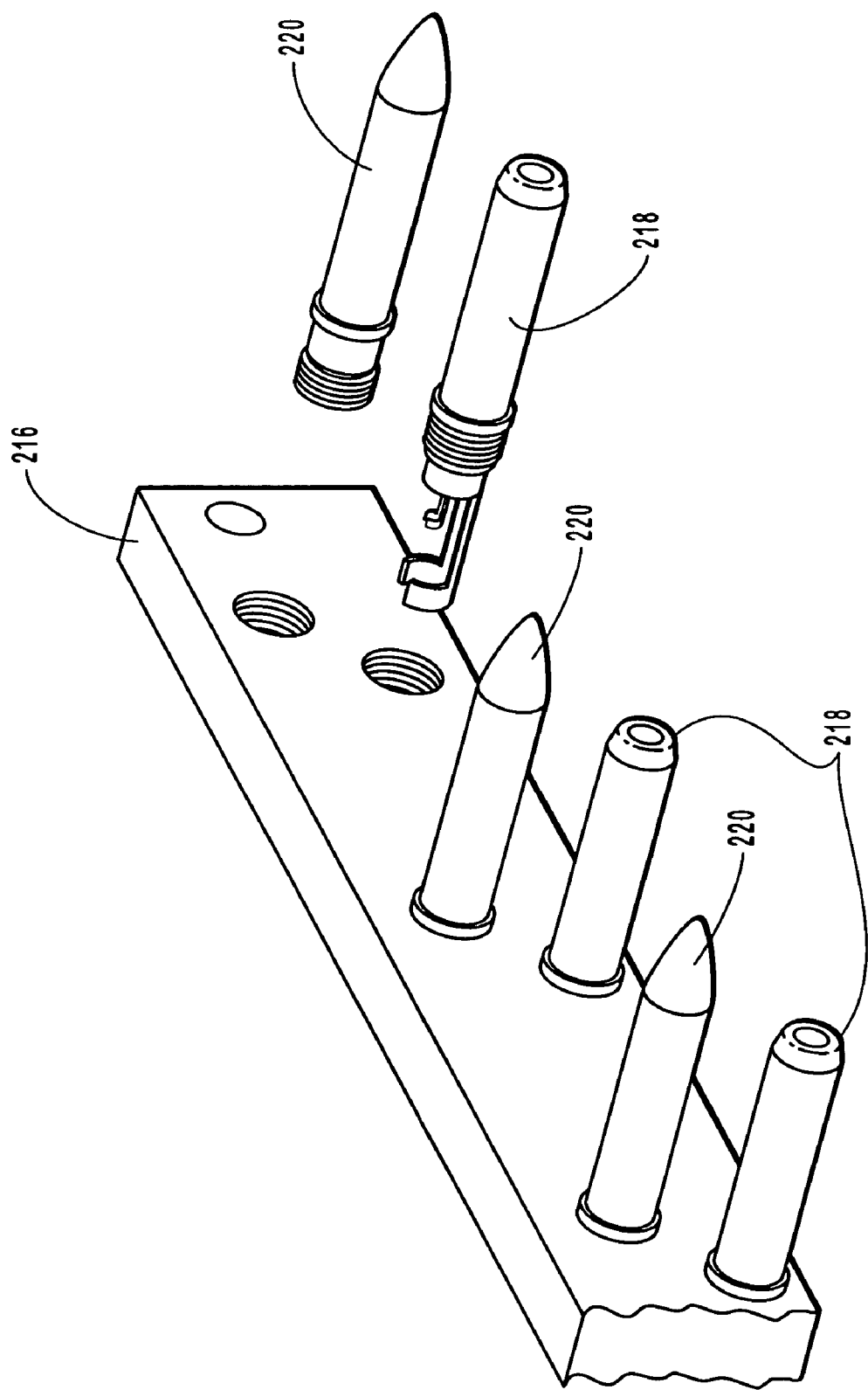
FIG. 10 is a perspective view of a barrel plug retainer assembly showing the barrel plug retainer, a plurality of barrel plugs, and a plurality of guide pins.
Figure 11:
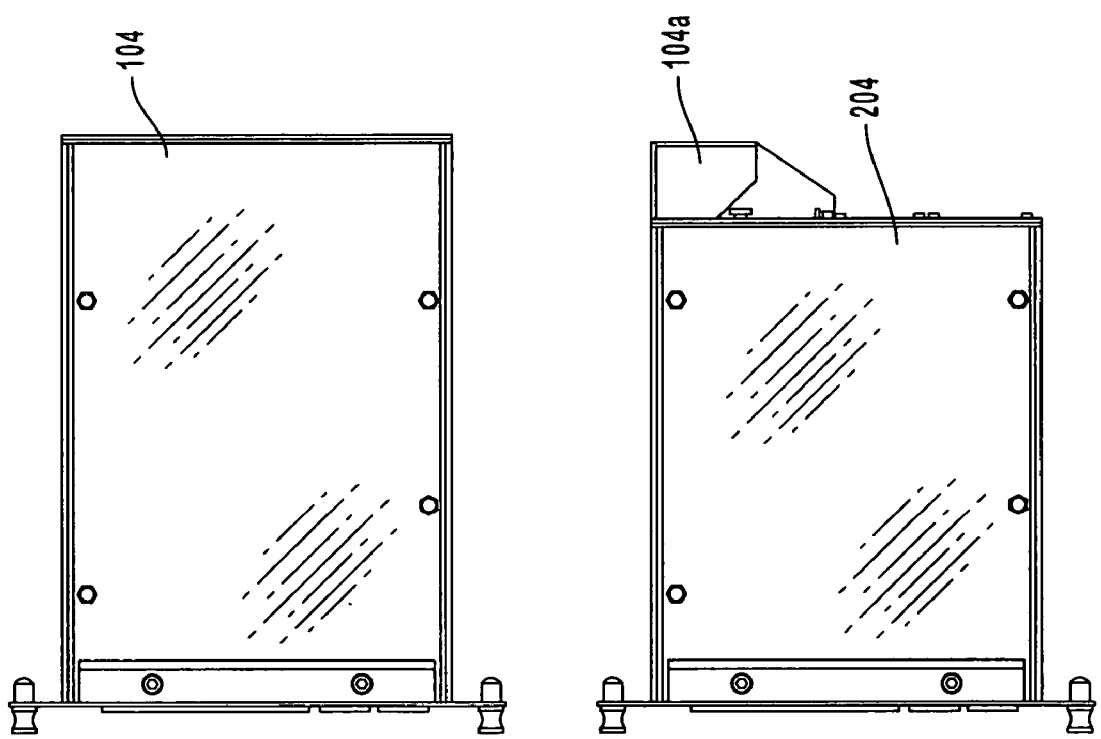
FIG. 11 is a side view of two embodiments of network tap modules.
Figure 12:
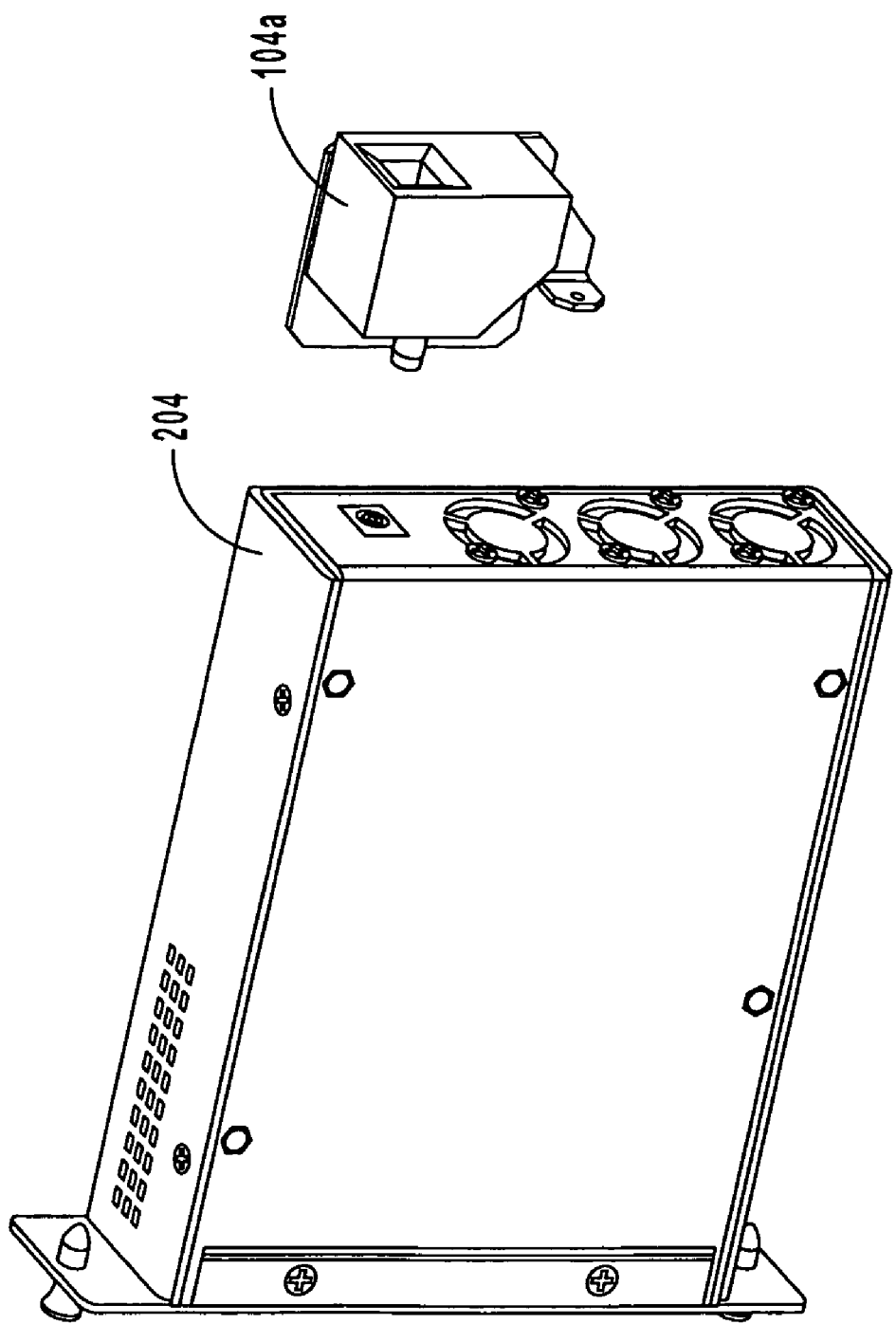
FIG. 12 is a perspective view of one of the network tap modules of FIG. 11.
Figure 13:
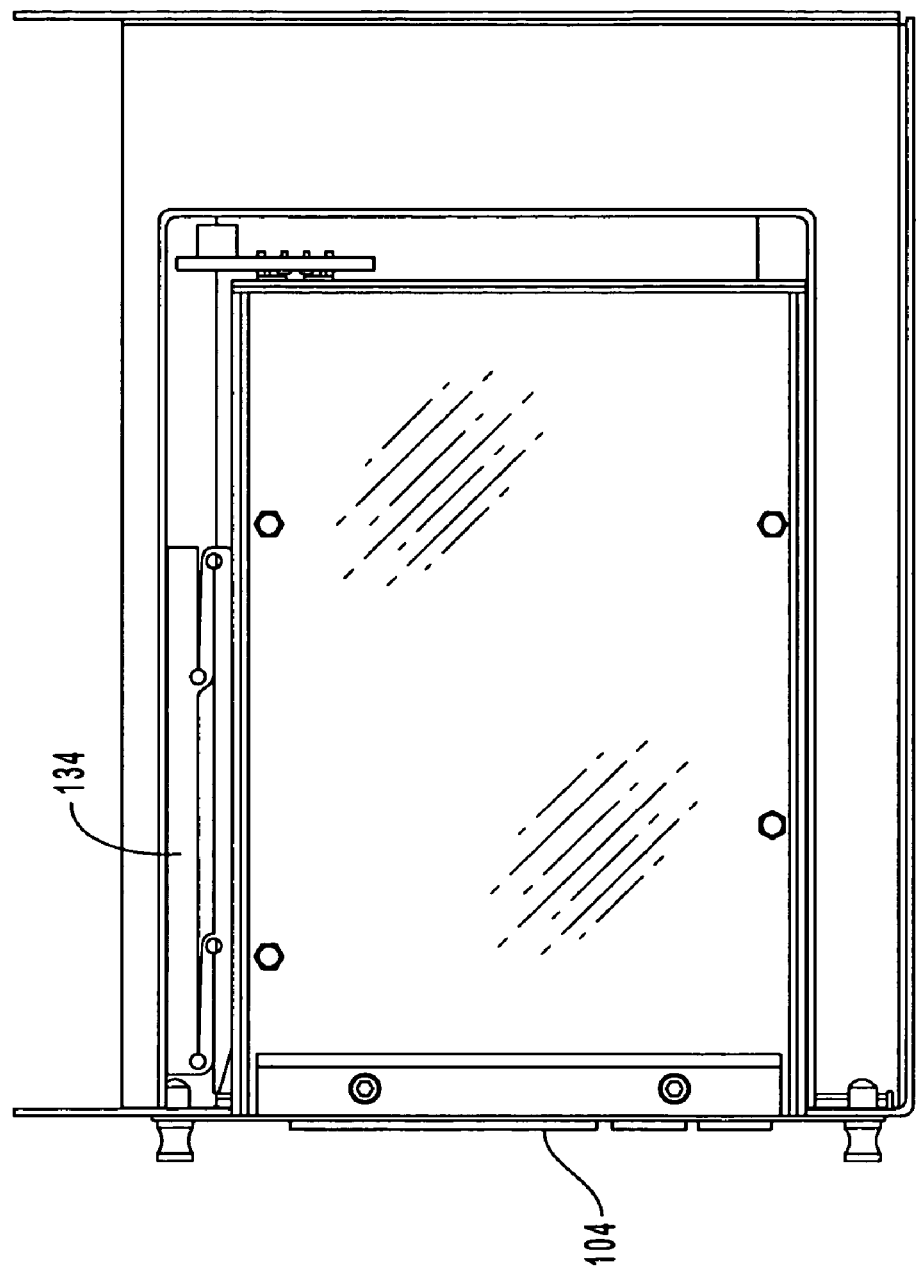
FIGS. 13 and 14 are cross sectional views through a portion of the housing of FIG. 1.

This low cost embodiment of the housing 200 for hot pluggable network taps, illustrated more fully in FIG. 7, includes a chassis 202 comprising sheet metal (not shown) and the above-mentioned barrel plug retainer assembly 202a, a power distribution PCBA 214, and two power supplies 206. The barrel plug retainer assembly 202a is formed from the barrel plug retainer 216, barrel plugs 218, guide pins 220 and DC wiring harness 222. One barrel plug 218 and guide pin 220 is required for each tap location, which is twelve in the current embodiment.

The 5.5 mm×2.1 mm barrel plug 218 has a threaded housing 224 that is meant to accept a threaded jacket 226 that covers the wire attachment point on the plug 218. The jacket 226 is removed and discarded for this application. FIG. 8 shows the barrel plug 218 with the jacket 226 installed, while FIG. 9 shows the plug 218 as used with the jacket 226 removed.

A barrel plug 218 is threaded into the barrel plug retainer 216, one for each tap location. This embodiment also includes a guide pin 220 at each tap position. This guide pin 220 allows a smooth engagement of the tap in chassis 200 with relaxed guide system tolerances.

The barrel plug retainer 216 may be a machined plastic part. As a machined part, it provides the advantage of maintaining required positional tolerance that fall easily within common machining practices. Other embodiments may require that positional tolerances be held within the sheet metal chassis that are tighter than those commonly found in sheet metal practices.

The DC wiring harness 222 includes a pair of wires 228 soldered to each barrel plug 218. No termination is required for the DC wire pairs 228 as they insert directly into the DC output connector in the power distribution PCBA 214. The power distribution PCBA 214 includes a rectangular shaped PCB that holds an interface connector for each of the two power supplies 206, the DC output connector 210, hot-swap circuitry for each tap location, fan power connectors (not shown) and status signal connectors (not shown).

A single connector 210 for each of the two power supplies provides AC input and DC output voltages. It also provides pins (not shown) for the power supply fan and status signals. This connector 210 replaces the two connectors (110 and 112) that were required for each of the power supplies 106 in the embodiment of housing 100. A single connector 210 makes it easier to mate the power supply 206 during hot swap installation.

The hot-swap circuitry allows each tap 104 to be inserted or removed from the chassis 100 without affecting the other installed taps 104. This circuitry is located on the tap adapter in the first embodiment due to lack of space on the chassis backplane. Placing all twelve hot-swap circuits on one PCBA has several advantages. It reduces cost, since it is more effective to assemble a PCBA with a common, step-and-repeat pattern than build multiple PCBAs each with a single pattern. It also provides enhanced tap cooling, as the tap no longer requires a PCBA to be mounted on the back side adjacent to the cooling fan openings. One of the most significant factors is that it allows use of the simplified tap adapter, since no PCBA is required on the tap.

The power supplies 206 have also been significantly simplified with corresponding cost reductions. The use of a single interface connector 210 for each power supply 206 eliminates the cost of a second connector and the need for tight positional tolerances between them. It also allows the use of a simple open frame chassis which incorporates built-in pull handles for further cost reduction.

The sheet metal portion of chassis 202 of this low-cost embodiment is essentially the same as that of the first embodiment, with the exception of the mounting detail for the barrel plug retainer 216 and the interface for the power supply 206.

Although FIG. 7 illustrates use of the housing 200 with a legacy network tap module 204 that requires use of an additional adapter, 104b, the housing can alternatively be used with network tap modules 104 which are designed specifically for use with the housings of the present invention.

2. Power Supply

Figure 3:
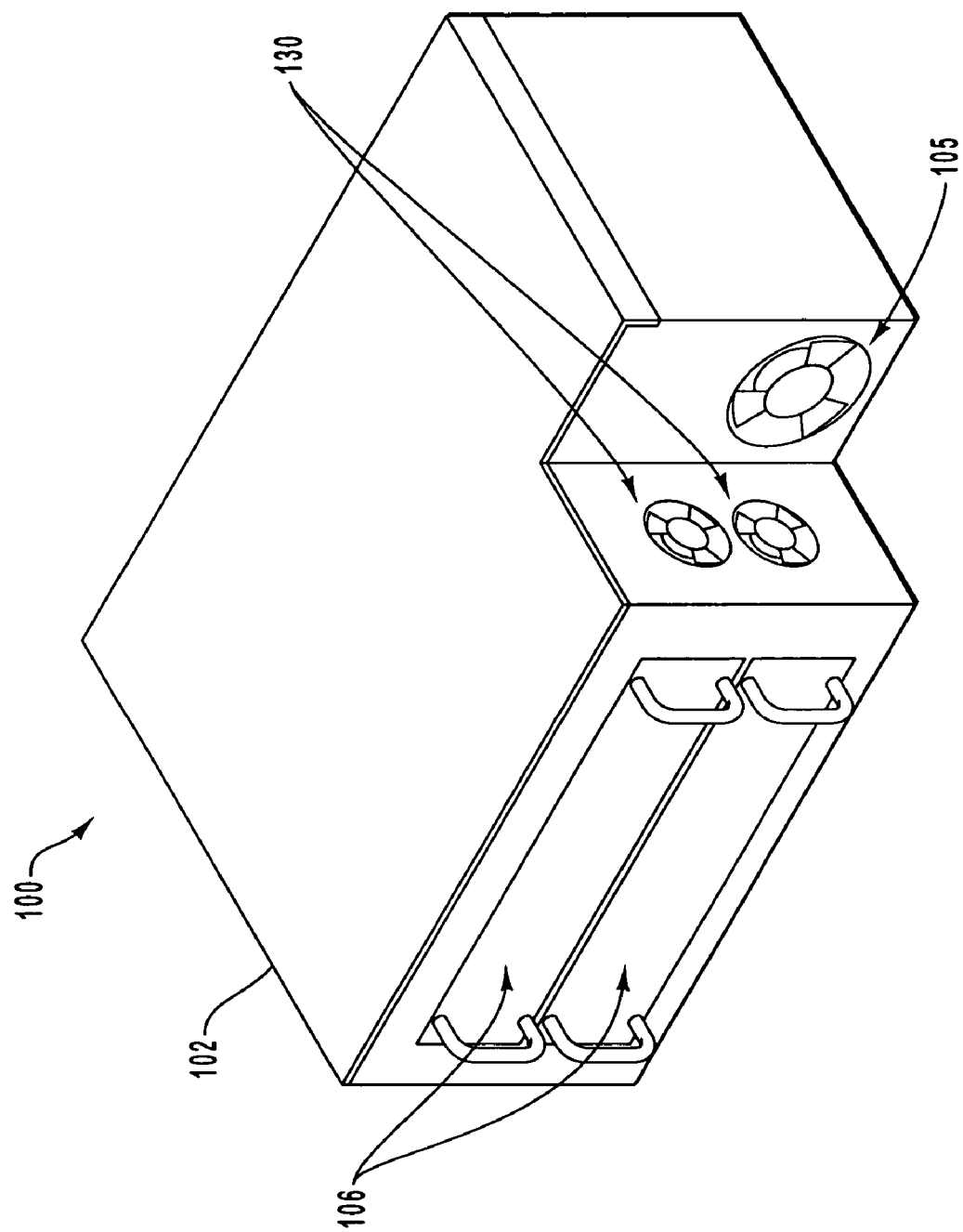
FIG. 3 is a rear perspective view of the embodiment of the housing of FIG. 1.

As shown in FIG. 3, the power supply 106 may be dual redundant, including two separate power sources. In addition, in an embodiment with a dual redundant power supply, the individual power sources may be hot-swappable. A power supply that is shared by multiple tap modules 104 in a single housing 100 eliminates the space and inconvenience that would otherwise be associated with each tap module 104 having its own power supply and corresponding power cables. The power supply 106 incorporated into the housing of the invention may also include cooling fans 130 or other means of cooling (e.g. heat sinks, etc). Cooling fans may be vented to the exterior of the housing 100 or 200. The redundant power supplies improve tap reliability and ensure that any particular tap will continue to operate in the event of a single power supply failure. Providing power supply hot-swap capability may further enhance network reliability. In the event of a power supply failure the failed unit may be replaced without powering down the tap.

The power supply 106 may be connected to a plurality of power supply connectors 108. This allows distribution of power to the individual power connectors 108, each power supply connector 108 being positioned to mate with and provide power to one network tap module 104. This configuration eliminates the need for separate power supplies, for each network tap module 104. An embodiment of this configuration is illustrated in FIG. 4. In this embodiment, the power supply connectors 108 are mounted to a backplane 102a, which forms a rear surface of the housing chassis 102.

Details regarding an adapter (e.g. adapters 104a and 104b) used in connection with the power supply of the housing in order to adapt legacy network tap modules to the power supply connectors is disclosed in U.S. Provisional Patent Application Ser. No. 60/470,582, entitled "HOT PLUGGABLE ADAPTER FOR LEGACY POWER SUPPLY CONNECTORS", filed May 15, 2003 and U.S. Provisional Patent Application Ser. No. 60/508,334, entitled "HOT PLUGGABLE ADAPTER FOR LEGACY POWER SUPPLY CONNECTORS", filed Oct. 2, 2003, both of which are incorporated herein by reference. FIGS. 5, 7, 11 and 12 illustrate examples of the adapters described in detail in the foregoing provisional patent application.

3. Monitoring Port

While redundant hot-swap power supplies add a significant level of reliability to a tap, it is important to know if a power supply has failed so that it can be replaced before the second power supply fails. According to an embodiment of the invention, this can be achieved by providing a status light on the chassis. However, a status light requires a person to visually inspect any and all taps in an installation to ensure they are operating properly. In a preferred embodiment, the status light is replaced or supplemented with a monitoring port that allows remote monitoring of tap functionality, including power supply condition. Low cost, off-the-shelf chipsets are commercially available to provide SNMP capabilities over Ethernet. The monitoring port chip set may be added to the backplane, the power distribution board or installed as a separate board in a convenient location. Remote monitoring applications may be a simple as a virtual status indicator light to a system with auto scanning, alarms and status information.

4. Displaceable Card Guides

In one currently preferred embodiment, the housing 100 includes a plurality of displaceable card guides 134. The card guides 134 allow the network tap modules 104 to be closely packed, while still providing a surface to guide each module 104 as it is inserted. This results in the housing 100 being capable of receiving a set of network tap modules 104 having a high packing ratio. An exemplary embodiment of the displaceable card guide 134 is seen in FIG. 4, and FIGS. 13–18.

Figure 14:
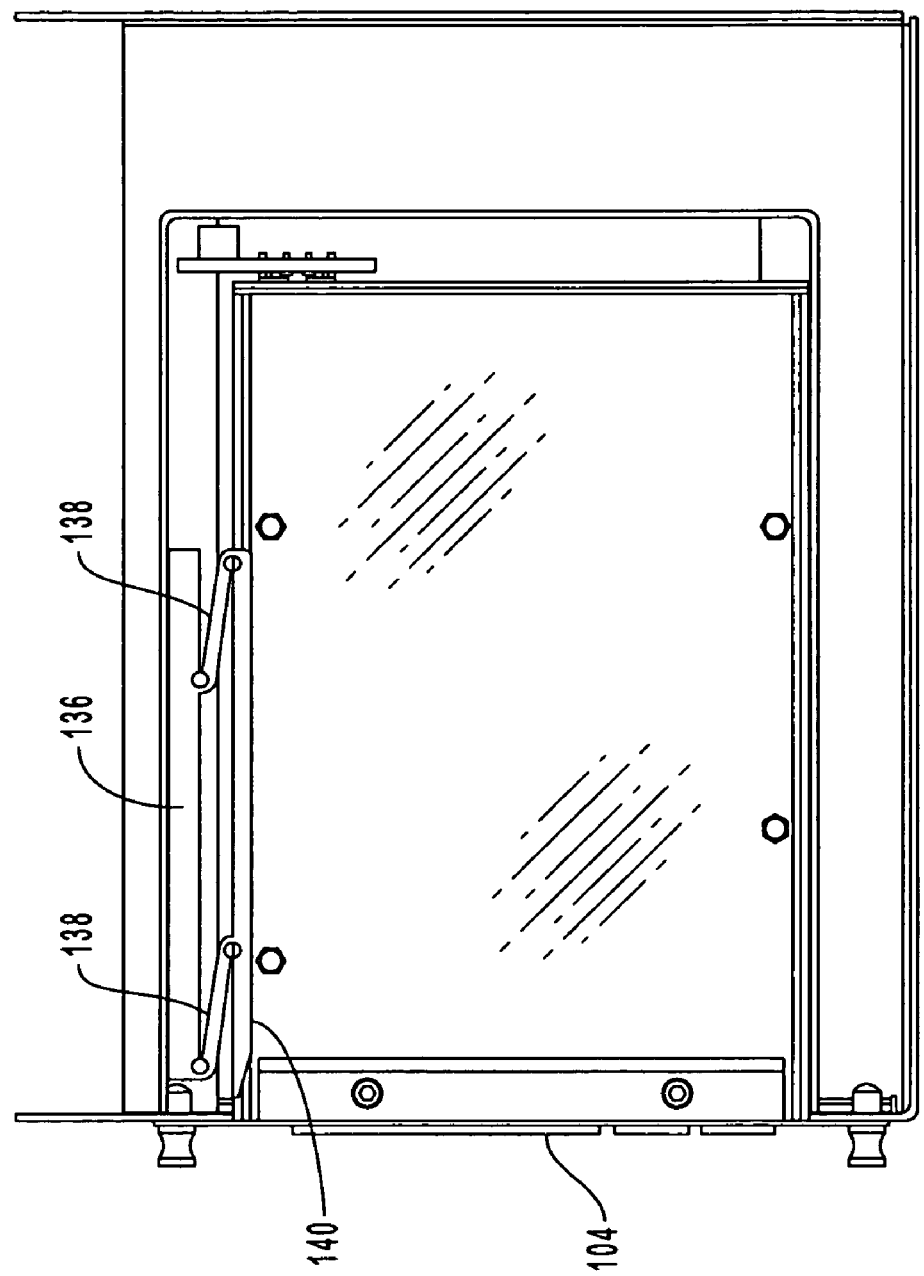
Figure 15:
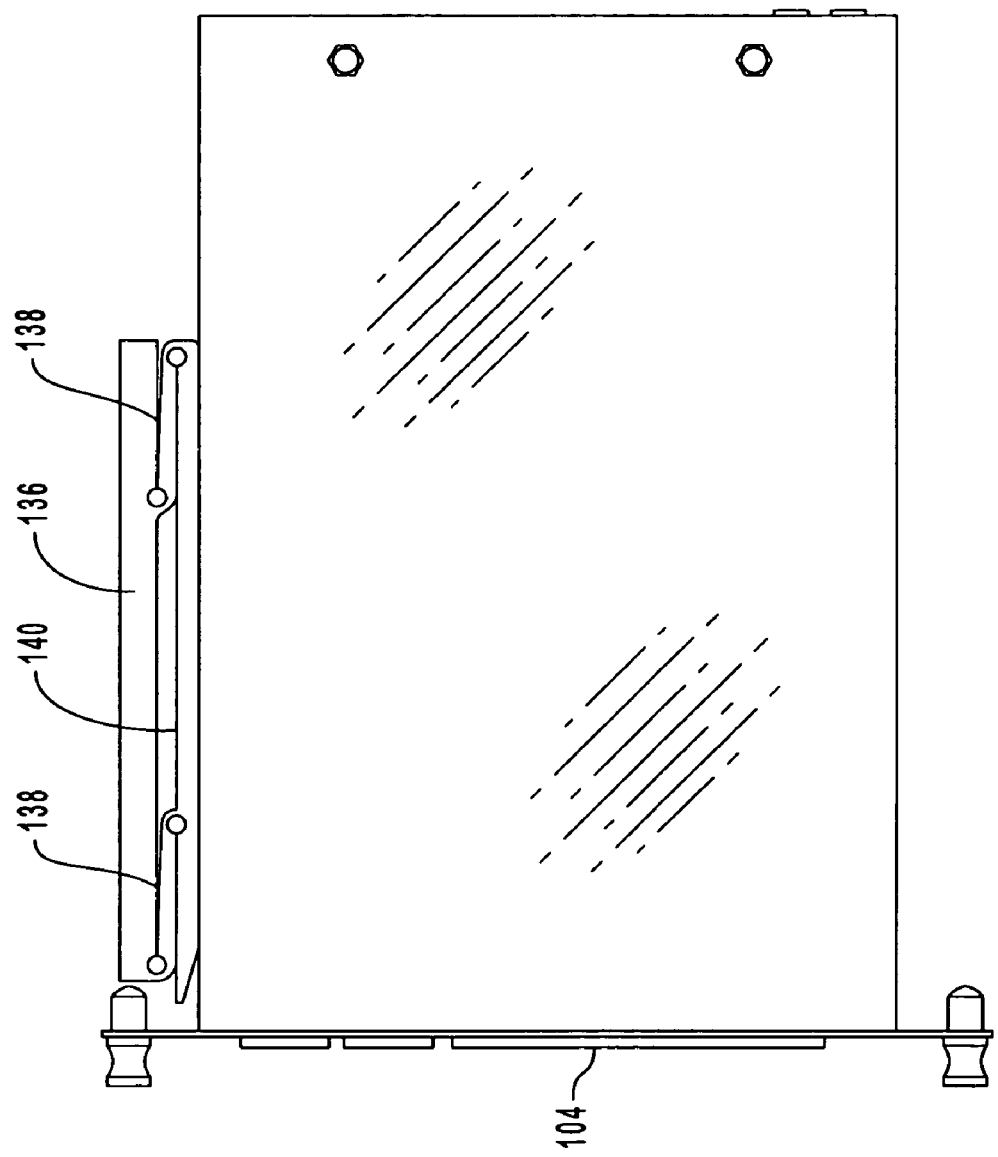
FIGS. 15 and 16 are side views of a card guide in a retracted and extended position.
Figure 16:
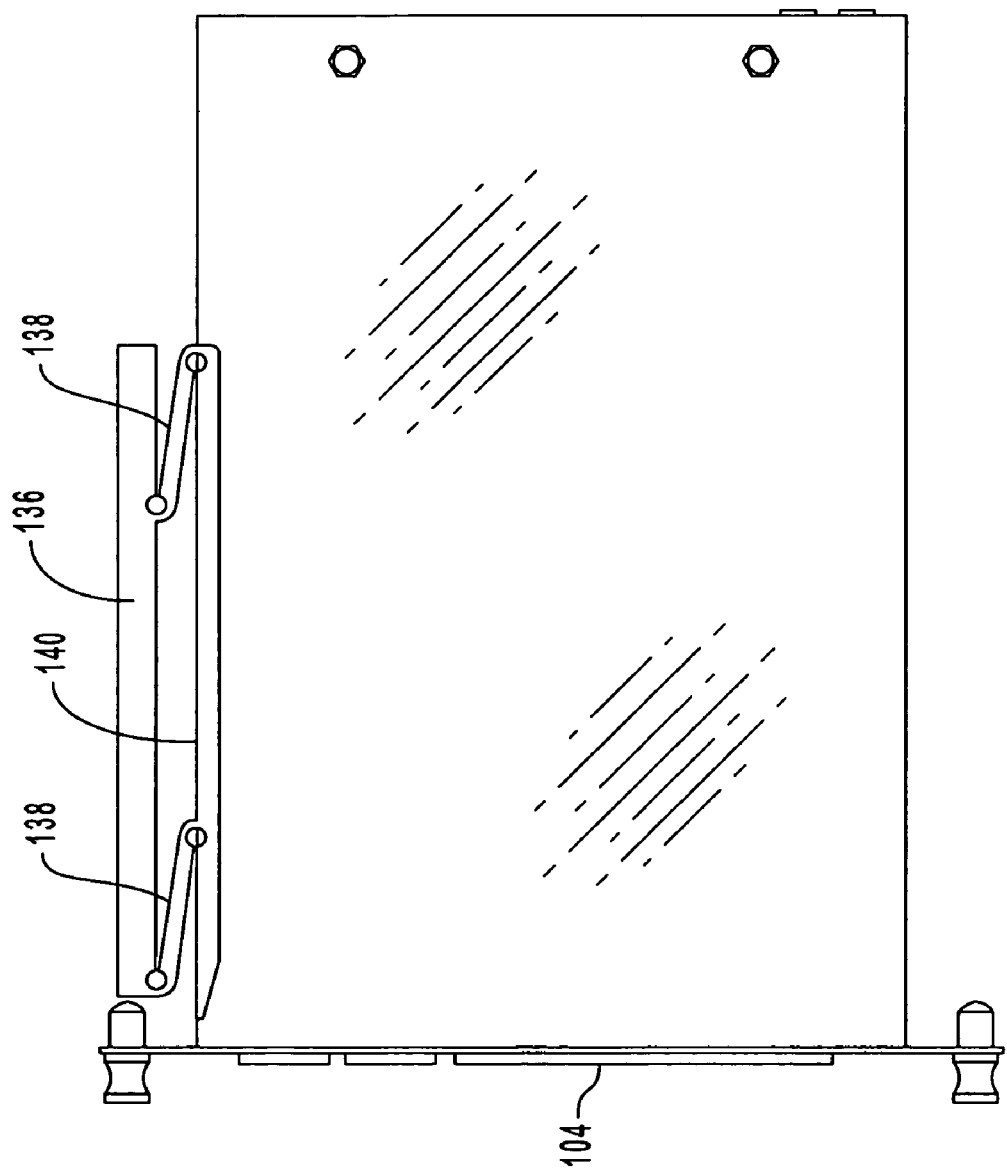
Figure 1:
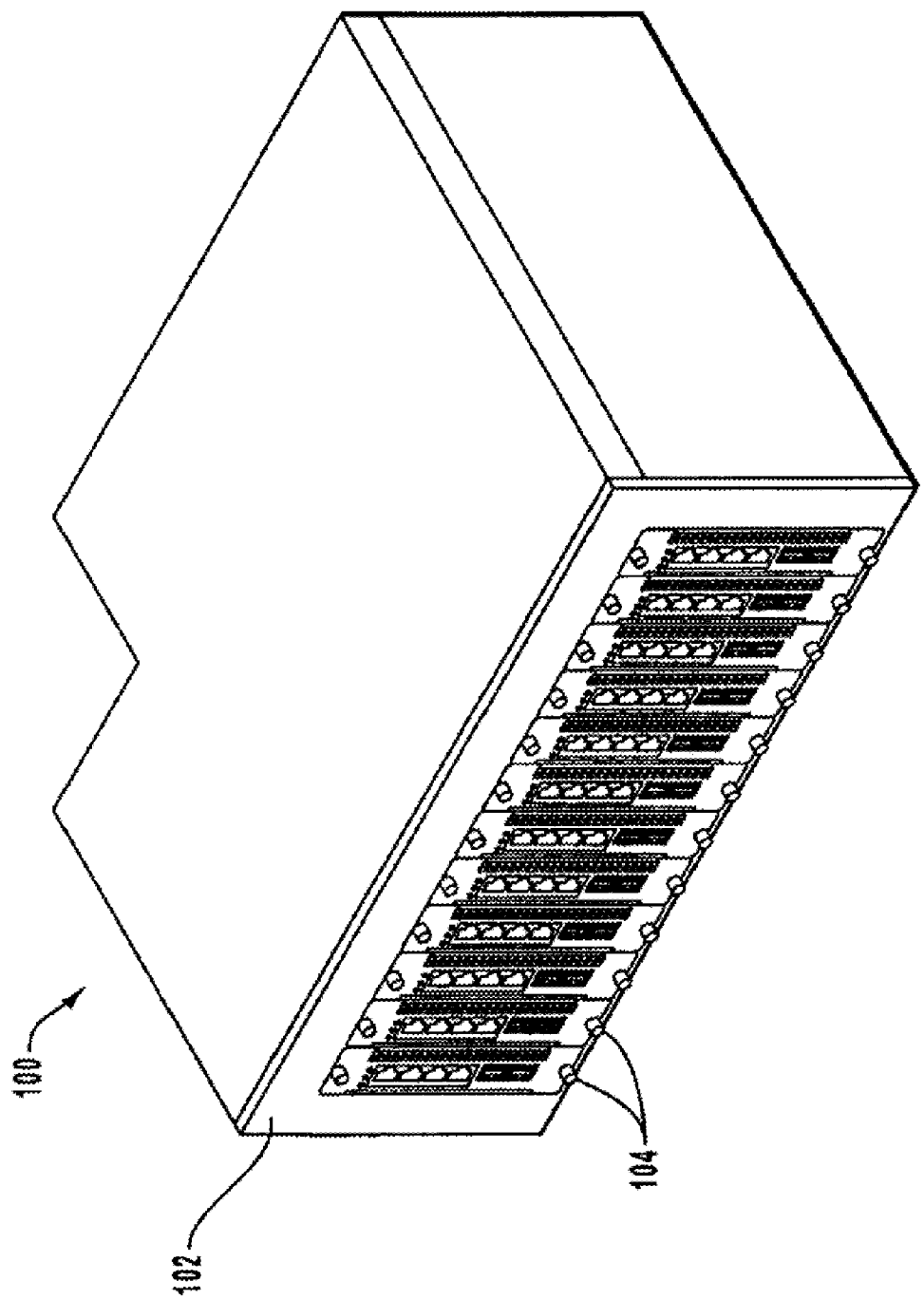

In the illustrated embodiment, the displaceable card guides 134 include a base 136, two retractable arms 138, and a guide 140. The base 136 is attached to the inside roof of the chassis 102. A first end of each retractable arm 138 is attached to the base 136, while a second opposite end of each arm 138 is attached to the guide 140. As illustrated in FIG. 17, as the module is inserted, it contacts the sloped leading edge of the guide 140. This contact continues as the module 104 is pushed into the chassis 102 of the housing 100. The retractable arms 138 progressively retract to a final position as illustrated in FIG. 14. Thus, the displaceable card guides 134 have two primary positions, including an extended position shown in FIG. 16, in which the tap position associated with the card guide 134 has not received a tap module 104, and a retracted position, shown in FIG. 15, in which the tap position associated with the card guide 134 has received a tap module 104.

According to one embodiment, the housing 100 includes one card guide 138 associated with each position designed to receive a network tap module except for the last position. Since a tap 104 may not be inserted beyond the last position, a fixed guide or the sidewall of the chassis 102 may be used in this position. For example, if the housing 100 is designed to receive up to 12 network tap modules 104, it will preferably include 11 retractable card guides 138 and one fixed guide. A tap 104 that is inserted into the housing 100 can be positioned at a card guide 138 that is adjacent on either side to a combination of 1) card guides 138 in their extended position at tap positions that have not received a tap module 104, 2) inserted tap modules 104, or 3) a sidewall of the chassis 102. In any of these combinations, the adjacent structures serve the function of card guides to constrain lateral motion of the network tap 104 as it is inserted into or withdrawn from the chassis 102 or while it is positioned within the chassis 102. For example, as a module 104 is inserted into the housing 100 at a location adjacent to tap positions that have not yet received tap modules, the card guides 138 on each immediately laterally adjacent side remain in the extended position, acting to guide the module 104 and constrain lateral motion as it moves into the chassis 102 of the housing 100. Likewise, when a module 104 is inserted into the housing 100 at a location adjacent to inserted tap modules or a sidewall of the housing chassis 102, the inserted tap modules 104 or the sidewall act to guide the module 104 and constrain lateral motion thereof.

Inclusion of the optional displaceable card guides 138 eliminates the need for interior walls or other such guides that would physically separate adjacent network tap modules 104 when inserted into the housing 100. Elimination of such structures allows the housing 100 to have a high packing ratio. Such structures are also difficult to manufacture and are prone to damage due to their very high aspect ratio. In summary, the housing 100 provides the ability to locate and maintain a plurality of network tap modules 104 in one location, while also eliminating the need for each module 104 to have its own power supply. Additional details regarding the displaceable card guides 138 that can be used with the housings of the invention are disclosed in U.S. Provisional Patent Application Ser. No. 60/470,835, entitled "DISPLACEABLE CARD GUIDE FOR HIGH PACKING RATIO HOUSINGS", filed May 15, 2003, which is incorporated by reference.

While the invention has been disclosed herein in the context of network tap modules, the principles of the invention can also be applied to other pluggable modular electronics or optical components. It will also be appreciated that the present invention may be embodied in other specific forms without departing from its spirit or essential characteristics.

The invention claimed is:

1. A housing for receiving hot-pluggable modules comprising:
   a chassis configured to receive a plurality of hot-pluggable modules, wherein the chassis comprises a barrel plug retainer assembly that includes a barrel plug retainer and a plurality of barrel plugs configured to electrically connect to the hot-pluggable modules; and
   a power supply for providing power to the plurality of barrel plugs, wherein each barrel plug is configured to provide power to a received hot-pluggable module.

2. The housing of claim 1, further comprising a plurality of displaceable card guides which are capable of assuming extended or retracted positions.

3. The housing of claim 2, wherein the displaceable card guides each comprise a base, two retractable arms, and a guide.

4. The housing of claim 2, wherein the displaceable card guides default to an extended position.

5. The housing of claim 2, wherein the base of each displaceable card guide is attached to the roof of the chassis.

6. The housing of claim 1, wherein the housing is configured for receiving 12 hot-pluggable modules.

7. The housing of claim 1, wherein the chassis includes at least one cooling fan or other means of cooling.

8. The housing of claim 1, wherein the chassis includes a backplane printed circuit board assembly.

9. The housing of claim 8, wherein the backplane printed circuit board assembly is configured to have a backwards L shape.

10. The housing of claim 8, wherein the backplane printed circuit board assembly includes a plurality of hot-swap connectors.

11. The housing of claim 8, wherein the backplane printed circuit board assembly includes connectors for connecting to the DC output of the power supply.

12. The housing of claim 8, wherein the backplane printed circuit board assembly includes fan connectors.

13. The housing of claim 8, wherein the backplane printed circuit board assembly includes status signals.

14. The housing of claim 1, wherein the barrel plug retainer assembly further includes a plurality of guide pins.

15. The housing of claim 1, wherein the barrel plug retainer is a machined plastic part.

16. The housing of claim 1, wherein the chassis further includes a power distribution printed circuit board assembly attached to the barrel plug retainer assembly.

17. The housing of claim 16, wherein the chassis further includes a DC wiring harness connected to the power distribution printed circuit board assembly, which DC wiring harness includes power wires for providing DC power to the barrel plugs.

18. The housing of claim 16, wherein the power distribution printed circuit board includes a single connector for providing both AC power input to the power supply and DC power output from the power supply to the power distribution printed circuit board.

19. The housing of claim 1, wherein the power supply is dual redundant.

20. The housing of claim 19, wherein the power supply is hot swappable.

21. The housing of claim 1, wherein the power supply includes cooling fans or other means of cooling.

22. The housing of claim 1, further comprising a status indicator that visually indicates a status of at least one of the plurality of hot-pluggable network tap modules.

23. The housing of claim 1, further comprising a monitoring port that enables a tap functionality of at least one of the plurality of hot-pluggable network tap modules to be monitored remotely.

24. The housing of claim 23, wherein the status is associated with a condition of the first power supply.

25. The housing of claim 1, wherein the first power supply is hot-swappable such that the first power supply can be replaced in the event of failure thereof without powering down any of the plurality of hot-pluggable network tap modules.

26. A housing for receiving hot-pluggable network tap modules comprising:
   a chassis configured to receive a plurality of hot-pluggable network tap modules;
   a power supply configured to provide power to a plurality of power supply connectors, wherein each power supply connector is configured to provide power to a received hot-pluggable network tap module through a barrel plug retainer assembly that is associated with the chassis and interfaces with a plurality of barrel plugs used to provide said power to the hot-pluggable network tap modules; and
   a plurality of displaceable card guides which are capable of assuming extended or retracted positions.

27. A system comprising:
   a chassis configured to receive a plurality of hot pluggable modules;
   at least one hot pluggable module received by the chassis; and
   at least one hot pluggable adapter comprising:
      an adapter block;
      a first adapter power connector configured to connect to a power jack of one of the at least one hot pluggable module; and
      a second adapter power connector configured to connect to a power supply connector of the chassis, wherein the first and second adapter power connectors are electrically connected so as to allow power to flow from the at least one power supply through the power supply connector of the chassis, through the second adapter power connector, through the first adapter power connector, and into at least one of the plurality of hot pluggable modules.

28. A system according to claim 27, further comprising:
at least one power supply connector; and
at least one power supply, the at least one power supply being configured to supply power via the at least one power supply connector to the at least one hot pluggable module.

29. A system according to claim 27, wherein the first and second adapter power connectors each comprise a conductive barrel style plug adapter that is inserted into a hole of the adapter block.

30. A system according to claim 28, wherein a first hot pluggable module is received in the chassis, the first module being connected directly to a corresponding one of a plurality of power supply connectors; and
a second hot pluggable module received in the chassis, the second hot pluggable module having a length that is shorter than a length of the first module, the second module being connected to a corresponding one of the plurality of power supply connectors using an adapter that compensates for the shorter length of the second module.

* * * * *

UNITED STATES PATENT AND TRADEMARK OFFICE
CERTIFICATE OF CORRECTION

PATENT NO. : 7,102,887 B2
APPLICATION NO. : 10/764592
DATED : September 5, 2006
INVENTOR(S) : Donald A. Blackwell Page 1 of 2

It is certified that error appears in the above-identified patent and that said Letters Patent is hereby corrected as shown below:

Drawings
Delete Drawing Sheet 1 of 17 and substitute therefor the attached drawing Sheet 1

Column 1
Line 20, after "modules", insert --.--

Column 6
Line 11, change "200" to --100--
Line 13, change "202" to --102--
Line 31, change "200" to --102--
Line 58, change "100" to --102--

Column 7
Line 10, change "202" to --102--
Line 15, change "200" to --100--
Line 34, change "100 or 200." to --100.--

Column 10
Line 28, remove "network taps"
Line 31, remove "network taps"
Line 38, remove "network taps"

Signed and Sealed this

Eighteenth Day of November, 2008

JON W. DUDAS
*Director of the United States Patent and Trademark Office*